US011871595B2

(12) United States Patent
Liu et al.

(10) Patent No.: US 11,871,595 B2
(45) Date of Patent: Jan. 9, 2024

(54) ORGANIC ELECTROLUMINESCENT STRUCTURE AND FABRICATION METHOD THEREOF, AND DISPLAY DEVICE

(71) Applicant: BOE TECHNOLOGY GROUP CO., LTD., Beijing (CN)

(72) Inventors: Li Liu, Beijing (CN); Pengcheng Lu, Beijing (CN); Shengji Yang, Beijing (CN); Kui Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 380 days.

(21) Appl. No.: 17/423,864

(22) PCT Filed: Jan. 5, 2021

(86) PCT No.: PCT/CN2021/070358
§ 371 (c)(1),
(2) Date: Jul. 17, 2021

(87) PCT Pub. No.: WO2021/139656
PCT Pub. Date: Jul. 15, 2021

(65) Prior Publication Data
US 2022/0102665 A1   Mar. 31, 2022

(30) Foreign Application Priority Data
Jan. 6, 2020   (CN) .......................... 202010009942.1

(51) Int. Cl.
H01L 51/50 (2006.01)
H01L 51/52 (2006.01)
(Continued)

(52) U.S. Cl.
CPC ............. *H10K 50/17* (2023.02); *H10K 50/81* (2023.02); *H10K 50/82* (2023.02); *H10K 50/844* (2023.02);
(Continued)

(58) Field of Classification Search
CPC ........ H10K 50/17; H10K 50/81; H10K 50/82; H10K 50/822; H10K 50/84; H10K 50/844; H10K 71/00; H10K 2102/351
See application file for complete search history.

(56) References Cited

U.S. PATENT DOCUMENTS 5,701,055 A   12/1997  Nagayama et al.
5,952,037 A    9/1999  Nagayama et al.
(Continued)

FOREIGN PATENT DOCUMENTS

CN   1742517 A   3/2006
CN   1811864 A   8/2006
(Continued)

OTHER PUBLICATIONS

International Search Report and Written Opinion for International Application No. PCT/CN2021/070358 dated Apr. 1, 2021.
(Continued)

Primary Examiner — David C Spalla
(74) Attorney, Agent, or Firm — Perilla Knox & Hildebrandt LLP; Kenneth A. Knox

(57) ABSTRACT

This disclosure relates to an organic electroluminescent structure, a fabrication method thereof, and a display device. The organic electroluminescent structure includes a base substrate; a passivation protective layer formed at a side of the base substrate, in which the passivation protective layer is formed with a plurality of inner cutting portions arranged at intervals at a side facing away from the base substrate; an anode layer including a plurality of anodes arranged at intervals, and each of the anodes is correspondingly formed on the second surface; an organic light-emitting functional layer having a hole injection layer, in which the hole injection layer includes a plurality of hole injection blocks arranged at intervals, and each of the hole injection blocks is correspondingly formed on one anode; and a cathode layer (Continued)

formed at a side of the organic light-emitting functional layer facing away from the anode layer.

20 Claims, 3 Drawing Sheets

(51) Int. Cl.
    *H01L 51/56*     (2006.01)
    *H10K 50/17*     (2023.01)
    *H10K 50/81*     (2023.01)
    *H10K 50/82*     (2023.01)
    *H10K 50/844*     (2023.01)
    *H10K 71/00*     (2023.01)
    *H10K 102/00*     (2023.01)

(52) U.S. Cl.
    CPC ....... *H10K 71/00* (2023.02); *H10K 2102/351* (2023.02)

(56) References Cited

U.S. PATENT DOCUMENTS

| | | | |
|---|---|---|---|
| 6,221,563 B1 | 4/2001 | Hryhorenko et al. | |
| 7,622,899 B2 | 11/2009 | Yi et al. | |
| 7,876,039 B2 | 1/2011 | Kang et al. | |
| 8,182,301 B2 | 5/2012 | Kang et al. | |
| 9,401,494 B2 | 7/2016 | Miura | |
| 10,199,448 B2 | 2/2019 | Kim et al. | |
| 10,535,725 B2 | 1/2020 | Kim et al. | |
| 2006/0003266 A1 | 1/2006 | Yi et al. | |
| 2006/0086938 A1 | 4/2006 | Kang et al. | |
| 2007/0290604 A1* | 12/2007 | Sakanoue | H10K 50/17 313/503 |
| 2011/0086451 A1 | 4/2011 | Kang et al. | |
| 2014/0231789 A1* | 8/2014 | Miura | H10K 50/813 257/40 |
| 2015/0162563 A1* | 6/2015 | Ide | H10K 50/846 438/26 |
| 2016/0211477 A1* | 7/2016 | Malik | H10K 50/17 |
| 2017/0373129 A1 | 12/2017 | Kim et al. | |
| 2019/0157373 A1 | 5/2019 | Kim et al. | |
| 2019/0245015 A1* | 8/2019 | Lee | H10K 59/122 |

FOREIGN PATENT DOCUMENTS

| | | |
|---|---|---|
| CN | 103891408 A | 6/2014 |
| CN | 108565347 A | 9/2018 |
| CN | 109585699 A | 4/2019 |
| EP | 0732868 A1 | 9/1996 |
| EP | 0732868 B1 | 5/2000 |
| EP | 1076369 A2 | 2/2001 |
| EP | 1076369 A3 | 6/2004 |
| EP | 1665894 A1 | 6/2006 |
| EP | 1665894 A4 | 12/2009 |
| JP | H09330792 A | 12/1997 |
| JP | 3302262 B2 | 7/2002 |
| WO | 2005027584 A1 | 3/2005 |

OTHER PUBLICATIONS

First Office Action for CN Patent Application No. 202010009942.1 dated Oct. 26, 2021.

* cited by examiner

ORGANIC ELECTROLUMINESCENT STRUCTURE AND FABRICATION METHOD THEREOF, AND DISPLAY DEVICE

CROSS-REFERENCE TO RELATED APPLICATIONS

The present application is a national phase application under 35 U.S.C. § 371 of International Application No. PCT/CN2021/070358 filed Jan. 5, 2021, which claims the benefit of and priority to Chinese Patent Application No. 202010009942.1, entitled "ORGANIC ELECTROLUMINESCENT STRUCTURE AND FABRICATION METHOD THEREOF, AND DISPLAY DEVICE", and filed on Jan. 6, 2020, the entire contents of which are hereby incorporated by reference.

TECHNICAL FIELD

The present disclosure relates to the technical field of display and, in particular, to an organic electroluminescent structure, a fabrication method thereof, and a display device.

BACKGROUND

As a novel display technology, OLED (Organic Light-Emitting Diodes) display technology has been widely used in smart watches, mobile phones, tablet computers, displays etc. The silicon-based OLED display uses a monocrystalline silicon as an active driving backplane, and has excellent characteristics such as high pixel density, high integration, small size, easy carrying, good seismic performance, and ultra-low power consumption, and thereby being one of hot spots in a research for the display technology.

However, the existing silicon-based OLED are prone to crosstalk between different sub-pixels. One of the important reasons is that the hole injection layer (HIL) in direct contact with anodes is a common layer of the whole layer and has low resistivity, therefore, the HIL layer with low resistivity is apt to cause conduction between the sub-pixels.

It should be noted that the information disclosed in the above "Background" section is merely intended to reinforce understanding of the background technology of the present disclosure, accordingly the Background may include information that does not constitute the prior art as already known by an ordinary person skilled in the art.

SUMMARY

A purpose of this disclosure is to provide an organic electroluminescent structure and a fabrication method thereof, and a display device, improving the problem of crosstalk caused by the low resistivity of the hole injection layer, and thereby improving the display effect.

A first aspect of the present disclosure provides an organic electroluminescent structure. The organic electroluminescent structure includes:
 a base substrate;
 a passivation protective layer formed at a side of the base substrate, in which the passivation protective layer is formed with a plurality of inner cutting portions arranged at intervals at a side facing away from the base substrate, each of the inner cutting portions has a first surface towards the base substrate and a second surface away from the base substrate, an orthographic projection of the first surface on the base substrate is within an orthographic projection of the second surface on the base substrate, and there is a non-zero distance between edges of the first surface and the second surface;
 an anode layer including a plurality of anodes arranged at intervals, and each of the anodes is correspondingly formed on the second surface;
 an organic light-emitting functional layer having a hole injection layer, in which the hole injection layer includes a plurality of hole injection blocks arranged at intervals, and each of the hole injection blocks is correspondingly formed on one anode; and
 a cathode layer formed at a side of the organic light-emitting functional layer facing away from the anode layer.

In an exemplary embodiment of the present disclosure, in a direction from the first surface to the second surface, an area of a cross-section of the inner cutting portions gradually increases, and the cross-section is a plane parallel to the base substrate.

In an exemplary embodiment of the present disclosure, the orthographic projection of the first surface on the base substrate is in a center area of the orthographic projection of the second surface on the base substrate.

In an exemplary embodiment of the present disclosure, a thickness of the inner cutting portion is larger than a thickness of the hole injection layer.

In an exemplary embodiment of the present disclosure, the thickness of the inner cutting portion is 100 Å to 2500 Å.

In an exemplary embodiment of the present disclosure, the anode is a transparent electrode.

In an exemplary embodiment of the present disclosure, the organic electroluminescent structure further includes a metal composite layer having a plurality of metal composite portions arranged at intervals, each of the metal composite portions being connected with one anode.

The metal composite portion includes a metal protective film, a metal reflective film and a first conductive connection block sequentially stacked on the base substrate, in which the metal reflective film is at a side of the inner cutting portion away from the anode, and the first conductive connection block passes through the inner cutting portion and is connected with the anode.

In an exemplary embodiment of the present disclosure, the organic electroluminescent structure further includes driving circuit disposed at a side of the metal composite layer close to the base substrate.

The driving circuit includes a transistor, in which the transistor is connected with the metal composite layer through a second conductive connection block, and is provided with a semiconductor layer that is positioned inside the base substrate.

The second aspect of the present disclosure provides a fabrication method of an organic electroluminescent structure, which includes the following:
 forming a base substrate;
 forming a passivation protective layer and an anode layer at a side of the base substrate; in which the passivation protective layer is formed with a plurality of inner cutting portions arranged at intervals at a side away from the base substrate, each of the inner cutting portions has a first surface towards the base substrate and a second surface away from the base substrate, an orthographic projection of the first surface on the base substrate is within an orthographic projection of the second surface on the base substrate, and there is a non-zero distance between edges of the first surface and the second surface; the anode layer includes a plurality of anodes arranged at intervals, and each of the anodes is correspondingly formed on the second surface;

forming an organic light-emitting functional layer with a hole injection layer on the base substrate, in which the hole injection layer includes a plurality of hole injection blocks arranged at intervals, and each of the hole injection blocks is correspondingly formed on one anode;

forming a cathode layer at a side of the organic light-emitting functional layer facing away from the anode layer.

In an exemplary embodiment of the present disclosure, forming a passivation protective layer and an anode layer at a side of the base substrate, includes:

sequentially forming a passivation protective material and an anode material on the base substrate;

patterning the anode material and a side of the passivation protective material away from the base substrate, so as to form the anode layer and the passivation protective layer with a plurality of inner cutting portions arranged at intervals.

In an exemplary embodiment of the present disclosure, patterning the anode material and a side of the passivation protective material away from the base substrate, so as to form the anode layer and the passivation protective layer with a plurality of inner cutting portions arranged at intervals, includes:

patterning the anode material by using a first dry etching process to form the anode layer;

patterning a side of the passivation protective material away from the base substrate by using a second dry etching process mainly based on isotropy to form a plurality of inner cutting portions arranged at intervals.

In an exemplary embodiment of the present disclosure, forming an organic light-emitting functional layer with a hole injection layer on the base substrate, includes:

evaporating a hole injection material on the base substrate formed with the inner cutting portions by using an evaporation process to form a hole injection layer including a plurality of hole injection blocks arranged at intervals.

A third aspect of the present disclosure provides a display device including the organic electroluminescent structure described in any one of the above embodiments.

According to the technical solution provided by the present disclosure, the following beneficial effects can be achieved.

According to the organic electroluminescent structure and the fabrication method thereof, and the display device provided by the present disclosure, a plurality of inner cutting portions arranged at intervals are formed at a side of the passivation protective layer away from the base substrate, to perform a partition function when the hole injection layer is formed, that is, partitioning the formed hole injection layer into a plurality of hole injection blocks arranged at intervals, and each of the hole injection blocks being correspondingly formed on one of the anodes. Since the hole injection blocks on the anodes are arranged at intervals (i.e., independent from each other), the crosstalk problem occurred due to conduction between sub-pixels caused by the low resistivity of the hole injection layer can be improved, and the display effect can be improved. In addition, the organic electroluminescent structure is prepared without additional processing, that is, the preparation process is simple without requiring any photomask.

It should be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute part of this specification, illustrate embodiments consistent with the invention and, together with the description, serve to explain the principles of the invention. Apparently, the drawings in the following description are only for illustrating some embodiments of the present disclosure and those of ordinary skill in the art can also derive other drawings based on the drawings without paying any creative labor.

DETAILED DESCRIPTION

Figure 1:
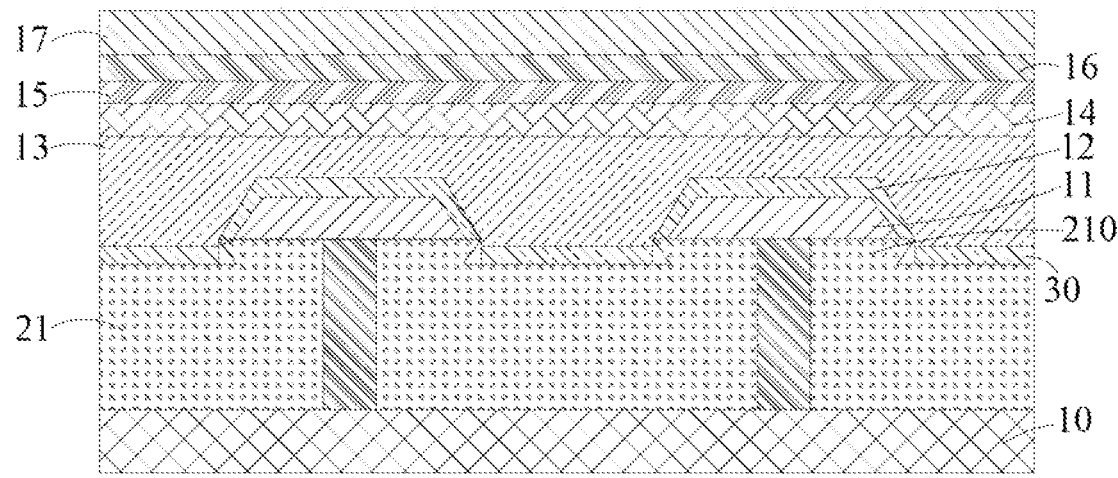
FIG. 1 is a schematic view of an organic electroluminescent structure according to one embodiment of the present disclosure.

Exemplary embodiments will now be described more fully by reference to the accompanying drawings. However, the exemplary embodiments can be implemented in various forms and should not be understood as being limited to the examples set forth herein; rather, the embodiments are provided so that this disclosure will be thorough and complete, and the conception of exemplary embodiments will be fully conveyed to those skilled in the art. The same reference signs in the drawings denote the same or similar structures and detailed description thereof will be omitted. In addition, the drawings are merely schematic illustrations of the present disclosure and are not necessarily drawn to scale.

Although relative terms such as "above" and "under" are used herein to describe the relationship of one component relative to another component, such terms are used herein only for the sake of convenience, for example, in the direction shown in the figure, it should be understood that if the referenced device is inversed upside down, a component described as "above" will become a component described as "under". When a structure is described as "above" another structure, it probably means that the structure is integrally formed on another structure, or, the structure is "directly" disposed on another structure, or, the structure is "indirectly" disposed on another structure through an additional structure.

The terms "a", "an", "the", "said" and "at least one", are used to express the presence of one or more the element/constitute/or the like. The terms "comprise", "include" and "have" are intended to be inclusive, and mean there may be additional elements/constituents/or the like other than the listed elements/constituents/or the like. The "first" and "second" are used only as marks, and are not numerical restriction to the objects.

In the related art, in order to improve the crosstalk occurred between different sub-pixels caused by the low resistivity of the hole injection layer, following solutions are proposed.

In a first solution, the hole injection layer with high resistivity is introduced to improve this problem; however, the novel hole injection layer has high research cost and long introduction period, the high resistivity of the hole injection layer will affect injection of hole ions, and the anode requires high voltage to obtain high hole ion injection.

In a second solution, in the large-scale OLED process, a way to improve this problem is generally to use a mask with pixel patterns when organic materials are evaporated, so as to isolate organic materials on different sub-pixels; however, since the pixel size of silicon-based OLED is small, this method is not suitable for the silicon-based OLED.

The list of reference numbers is as follows: 10: base substrate; 11: anode; 12: hole injection block; 13: hole transport layer; 14: organic light-emitting layer; 15: electron transport layer; 16: electron injection layer; 17: cathode layer; 18: metal protective film; 19: metal reflective film; 20: first conductive connection block; 21: passivation protective layer; 210: inner cutting portion; 22: packaging thin film; 23: color film substrate; 24: second conductive connection block; 25: source electrode; 26: drain electrode; 27: semiconductor layer; 28: gate electrode; 29: gate insulating layer; 30: hole injection waste.

To solve the above technical problems, one embodiment of this disclosure provides an organic electroluminescent structure, as shown in FIG. 1, which may include a base substrate 10, a passivation protective layer, an anode layer, an organic light-emitting functional layer, and a cathode layer.

The base substrate 10 may be a silicon substrate, but is not limited thereto, and may also be of various types depending on the specific situations. For example, an active layer (i.e., a semiconductor layer), a source electrode and a drain electrode of a transistor may be formed in the silicon substrate 101 by a doping process. Specifically, the following description will take the base substrate 10 as a silicon substrate as an example.

The passivation protective layer 21 is formed at a side of base substrate 10. A plurality of inner cutting portions 210 arranged at intervals are formed at a side of the passivation protective layer 21 away from the base substrate 10, and each of the inner cutting portions 210 has a first surface towards the base substrate 10 and a second surface away from the base substrate 10. An orthographic projection of the first surface on the base substrate 10 lies within an orthographic projection of the second surface on the base substrate 10, and there is a non-zero distance between an edge of the first surface and an edge of the second surface. That is, the edge of the orthographic projection of the first surface on the base substrate 10 is not overlapped with the edge of the orthographic projection of the second surface on the base substrate 10.

In this embodiment, a plurality of inner cutting portions 210 arranged at intervals are formed at a side of the passivation protective layer 21 away from the base substrate 10, to perform a partition function subsequently when the hole injection layer is formed, that is, the formed hole injection layer is partitioned into a plurality of hole injection blocks 12 arranged at intervals. This design does not require to add additional processing for preparation, and the preparation process is simple.

The anode layer may include a plurality of anodes 11 arranged at intervals, and each anode 11 is correspondingly formed on the second surface of the inner cutting portion 210. The area corresponding to each anode 11 can be understood as a sub-pixel area. For example, when the base substrate 10 is a silicon substrate, the anode 11 may be electrically connected with the source and drain electrodes in the silicon substrate. In this embodiment, the anode layer may be formed after being patterned.

The organic light-emitting functional layer has a hole injection layer with a plurality of hole injection blocks 12 arranged at intervals, and each hole injection block 12 is correspondingly formed on one of the anodes 11. In this embodiment, the hole injection blocks 12 on the anodes 11 are arranged at intervals (i.e., independent of each other), compared with the solution that the hole injection layer is a common layer arranged in the whole layer (i.e., the hole injection layer is not patterned and is integrally connected) in the related art, even if the hole injection layer has low resistivity, the conduction between sub-pixels can be avoided, so that the crosstalk between sub-pixels can be improved and thus the display effect can be improved.

It should be understood that the organic light-emitting functional layer not only has a hole injection layer, but also has a hole transport layer 13, an organic light-emitting layer 14, an electron transport layer 15 and an electron injection layer 16, wherein the hole transport layer 13, the organic light-emitting layer 14, the electron transport layer 15 and the electron injection layer 16 may all be formed on the whole surface by vapor deposition or other processes to reduce the use of masks with pixel patterns, thereby reducing the cost; however, it is not limited thereto, and the specific structures of the hole transport layer 13, the organic light emitting layer 14, the electron transport layer 15 and the electron injection layer 16 can be determined according to specific requirements.

It should be noted that the whole surface formation (whole surface arrangement) mentioned in this disclosure refers to the structure which is not patterned and connected integrally.

When the organic electroluminescent structure of this embodiment is a silicon-based OELD, the organic light-emitting layer 14 in the organic light-emitting functional layer may be formed on the whole surface. At this time, the material of the organic light-emitting layer 14 may be a material emitting white light, and the organic electroluminescent structure is required to match with a color film substrate 23 to form a display device together.

The cathode layer 17 is formed at a side of the organic light-emitting functional layer facing away from the anode layer. For example, the cathode layer 17 may be arranged as a whole layer, i.e., without being patterned, but is not limited thereto. The specific structure of the cathode layer 17 may be determined according to specific requirements. For example, the material of the cathode layer may be translucent, but not limited thereto, and may also be transparent, depending on the specific situations.

The organic electroluminescent structure described in the embodiments of this application will be described in detail with reference to the drawings.

As shown in FIG. 1, in this embodiment, the longitudinal section of the inner cutting portion 210 in the passivation protective layer 21 may be in an inverted trapezoid, and this longitudinal section may be a plane perpendicular to the base substrate 10. That is, in the direction from the first surface to the second surface, the cross-sectional area of the inner cutting portion 210 gradually increases, in order to facilitate for manufacturing and molding. This cross-section is a plane perpendicular to the base substrate 10, but it is not limited thereto. The longitudinal section of the inner cutting portion 210 may also be T-shaped, depending on the specific situations. Optionally, the orthographic projection of the first surface on the base substrate 10 in the inner cutting portion 210 lies within a center area of the orthographic projection of the second surface on the base substrate 10, so that the inner cutting portion 210 has sufficient inner cutting amount, so as to ensure that the hole injection layer may be partitioned into a plurality of mutually independent hole injection blocks 12 subsequently when the hole injection layer is formed. The distances between the edges of the first surface and the edges of the second surface may be equal.

The passivation protective layer 21 may have a single layer or a multi-layer structure, and the passivation protective layer 21 may be made of inorganic materials, such as silicon oxide, but not limited thereto, and may also be made of other inorganic insulating materials.

It should be noted that, in this example, the thickness of the inner cutting portion 210 is larger than that of the hole injection layer, so as to ensure that a plurality of mutually independent hole injection blocks 12 may be partitioned (separated) subsequently when the hole injection layer is formed. Optionally, the thickness of the inner cutting portion 210 is 100 Å to 2500 Å, such as 100 Å, 1000 Å, 1500 Å, 2500 Å, or the like. This design can avoid the situation that the hole injection layer cannot be partitioned since the thickness of the inner cutting portion is too small, and can also avoid the situation that the structural stability of the passivation protective layer 21 is weak since the thickness of the inner cutting portion is too large. That is, the inner cutting portion can partition the hole injection layer, and also ensure structural stability of the entire passivation protective layer 21 and protective effect of the passivation protective layer 21.

The longitudinal section of the anode 11 may be a regular trapezoid, but is not limited thereto, and other shapes may also be used. The anode 11 may be a transparent electrode. For example, the material of the anode 11 may include zinc (Zn), indium (In) or tin (Sn). In particular, the anode 11 may be formed of oxides of zinc (Zn), indium (In) or tin (Sn), such as indium tin oxide (ITO), zinc oxide (ZnO), indium oxide ($In_2O_3$), tin oxide ($SnO_2$), or the like. In particular, the material of the anode 11 may be composed of indium tin oxide (ITO). In addition, in this embodiment, the thickness of the anode 11 may be in a range of 100 Å (angstroms) to 3,000 Å, such as 100 Å, 1000 Å, 2000 Å, 3000 Å or the like, to ensure good conductivity and good transparency, but it is not limited thereto, and the thickness of the anode 11 may also be within other values, depending on the specific situations.

Figure 2:
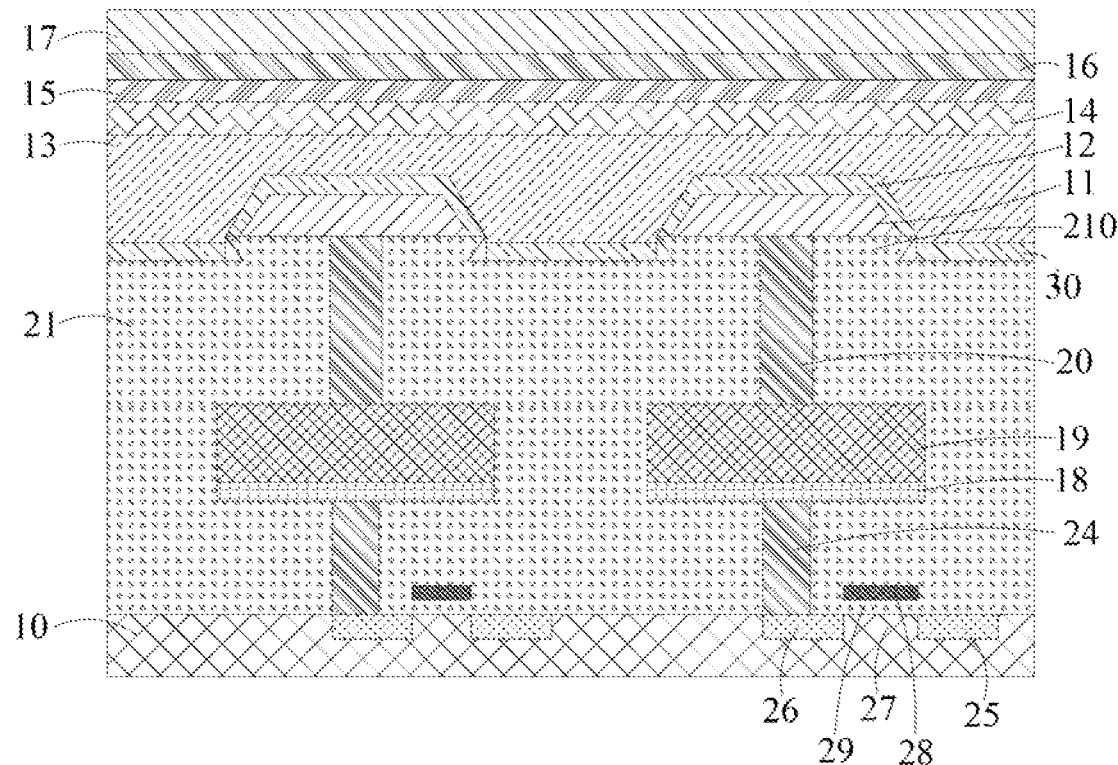
FIG. 2 is a schematic view of an organic electroluminescent structure according to another embodiment of the present disclosure.
Figure 3:
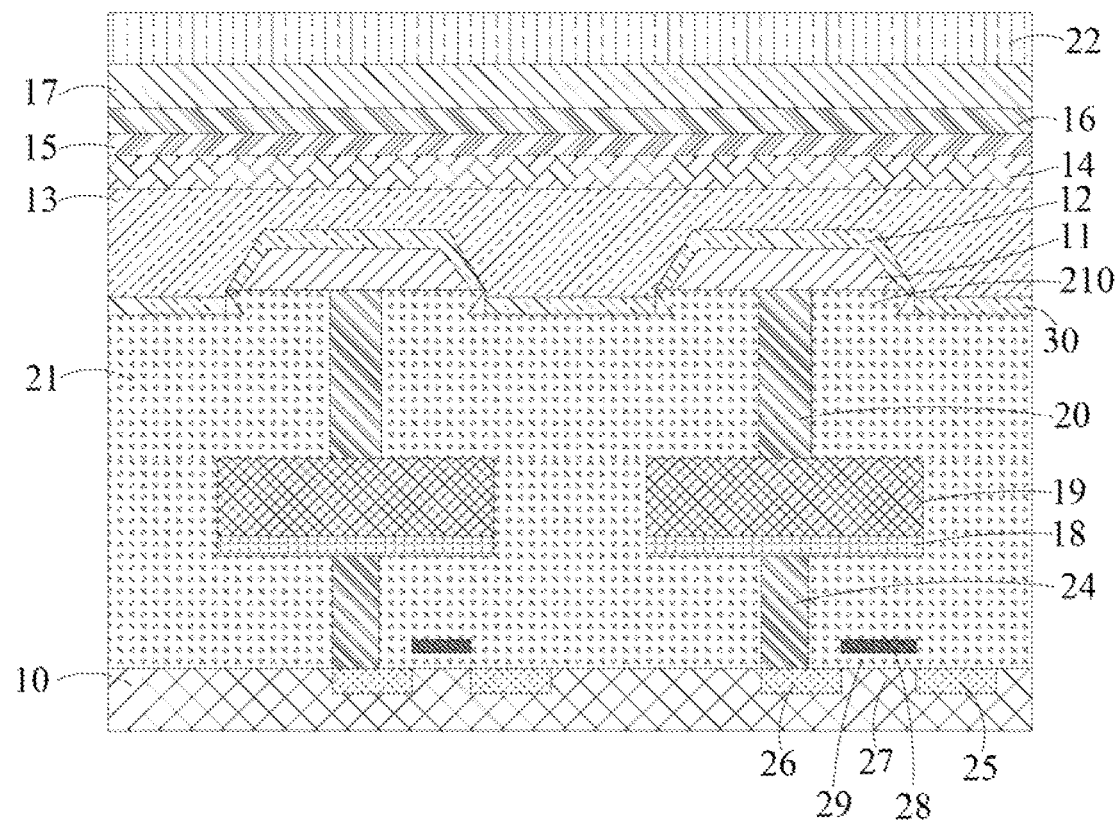
FIG. 3 is a schematic view of an organic electroluminescent structure according to further embodiment of the present disclosure.
Figure 4:
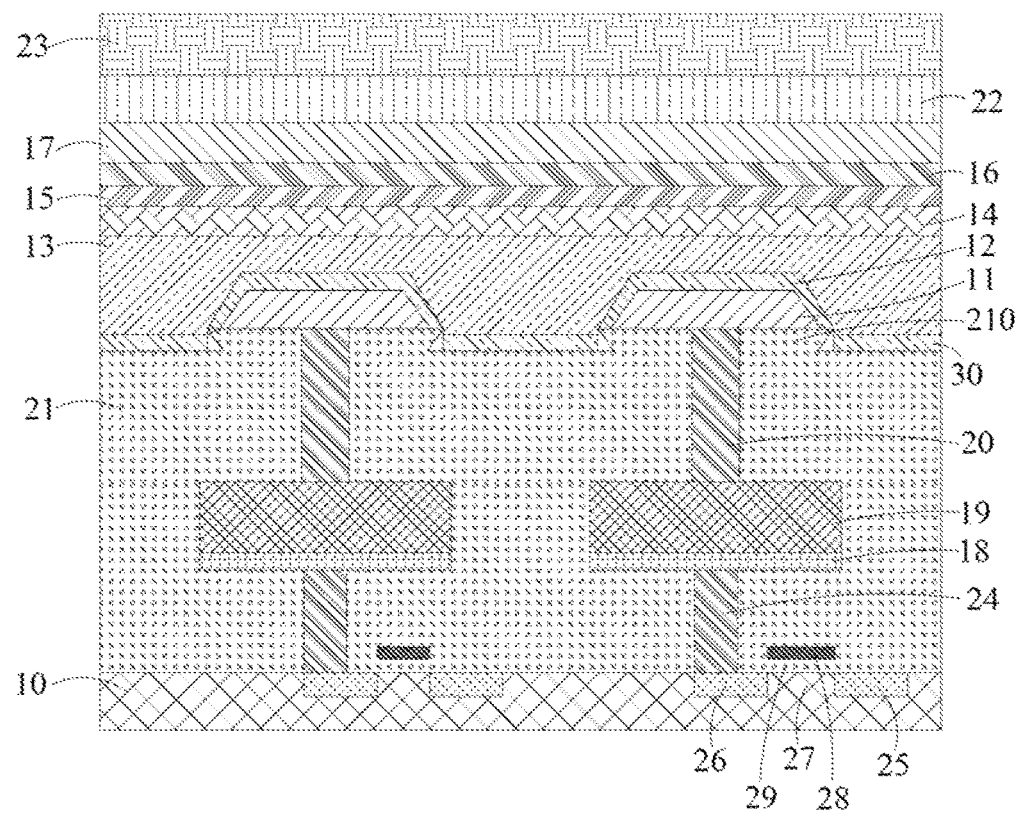
FIG. 4 is a schematic view of a display device according to another embodiment of the present disclosure.

In this embodiment, the organic electroluminescent structure may be top-emission-typed. In order to ensure luminous brightness of the organic electroluminescent structure, as shown in FIG. 2 to FIG. 4, a metal composite layer may be formed at a side of the anode 11 towards the base substrate 10, and may have a plurality of metal composite portions arranged at intervals, and each metal composite portion is connected with one of the anodes. The metal composite portion may reflect the light emitted from the organic light emitting layer 14 to improve the display brightness.

In detail, the metal composite portion may include a metal protective film 18, a metal reflective film 19 and a first conductive connection block 20 which are sequentially stacked on the base substrate 10. The metal reflective film 19 is located at a side of the passivation protective layer 21 away from the anode 11, the first conductive connection block 20 passes through the passivation protective layer 21 and is connected with the anode 11, that is, the passivation protective layer 21 is used to cover the metal composite layer to prevent the metal composite layer from being oxidized and corroded. It should be noted that the first conductive connection block 20 may be connected with the anode 11, and when the base substrate 10 is a silicon substrate, the metal protective film 18 may be connected with the source electrode and the drain electrode in the silicon substrate, that is, the anode 11 may be connected with the source electrode and the drain electrodes in the silicon substrate through the metal composite portion.

Optionally, the orthographic projection of the metal reflective film 19 on the base substrate 10 may lie within the orthographic projection of the metal protective film 18 on the base substrate 10, or may be completely overlapped with the orthographic projection of the metal protective film 18 on the base substrate 10. The orthographic projection of the first conductive connection block 20 on the base substrate 10 may lie within the orthographic projection of the first surface of the anode 11 on the base substrate 10.

Further, the organic electroluminescent structure may also include a driving circuit, which is arranged at a side of the metal composite layer close to the base substrate, wherein the driving circuit may include a transistor, but is not limited thereto, and may also include a capacitor, a signal line, or the like. The transistor is connected with the metal composite layer through the second conductive connection block, specifically connected with the metal protective film 18 in the metal composite layer. In this embodiment, the transistor may have a semiconductor layer 27 located inside the base substrate 10, that is, when the base substrate 10 is a silicon substrate, the semiconductor layer 27 may belong to a part of the silicon substrate. It should be understood that the transistor may also have a source electrode 25, a drain electrode 26, a gate electrode 28 and a gate insulating layer 29. It should be noted that the source electrode 25 and the drain electrode 26 may also form the inside of the silicon substrate. Specifically, a part of the structure in the silicon substrate may be treated by doping process to form the semiconductor layer 27, the source electrode 25 and the drain electrode 26 of the transistor. For example, the first conductive connection block 20 and the second conductive connection block 24 may be made of tungsten, but is not limited thereto, and may also be made of other conductive materials. The metal reflective film 19 may be composed of a metal material with high reflectivity, such as aluminum, but is not limited thereto, and may also be composed of other metal materials. The metal protective film 18 may have a single-layer or multi-layer structure. The metal protective film 18 may be made of titanium or titanium nitride. Alternatively, the metal protective film 18 may be titanium nitride, which has high stability and does not react with other metals at a normal temperature. Therefore, a side of the metal reflective film 19 is formed by titanium nitride to protect the metal reflective film 19 from being oxidized and corroded. In addition, when the metal reflective film 19 is made of aluminum, since the chemical property of titanium nitride are closely related to that of aluminum, there is no problem of similar compatibility, and titanium nitride has ultra-high heat resistance, so that a titanium nitride layer is directly formed at a side of the aluminum layer, which does not reduce the conductivity of the aluminum layer, and thus protect the aluminum layer.

Due to the high resistivity of titanium nitride, when titanium nitride is used as the metal protective layer, it is not suitable that the titanium nitride has over thickness.

It should be noted that, as shown in FIG. 3 and FIG. 4, the organic electroluminescent structure may further include a packaging thin film 22. The packaging thin film 22 may be formed at a side of the cathode layer 17 facing away from the base substrate 10, for protecting the organic light-emitting functional layer in the organic electroluminescent structure. The packaging thin film 22 may have a single-layer or multi-layer structure. Optionally, the packaging thin film 22 may include at least one organic packaging layer and at least one inorganic packaging layer, which are alternately arranged.

Figure 5:
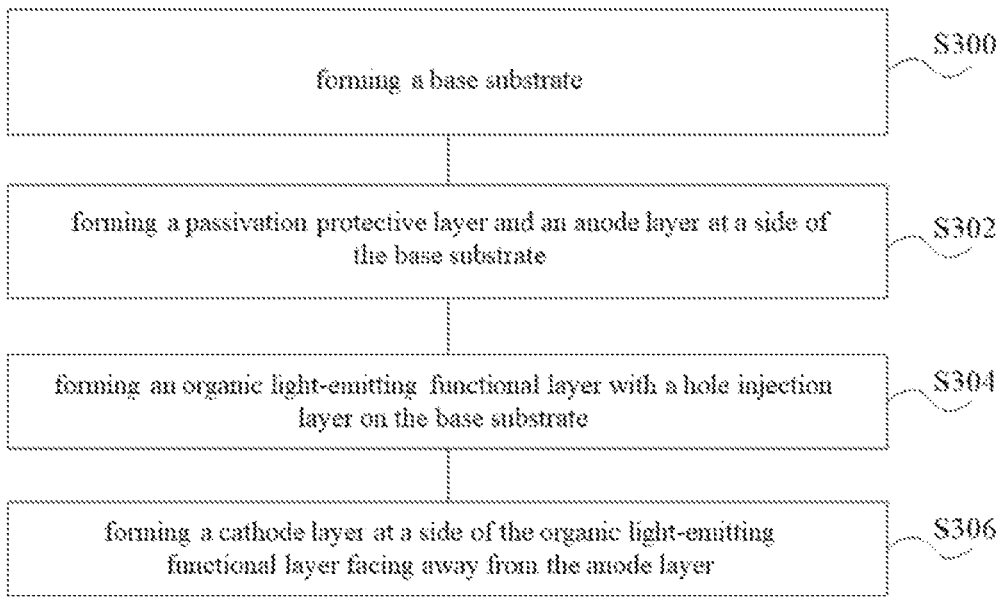
FIG. 5 is a flowchart of an organic electroluminescent structure according to one embodiment of the present disclosure.
Figure 6:
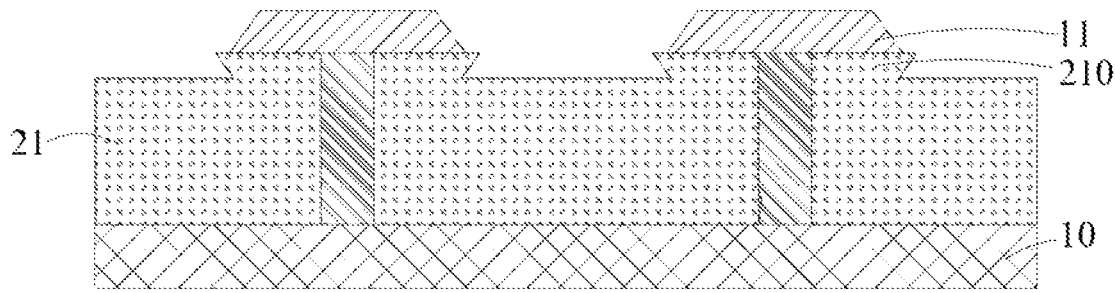
FIG. 6 is a schematic view after S302 is completed.

Another embodiment of the present disclosure also provides a fabrication method of the organic electroluminescent structure, as shown in FIG. 5, the fabrication method may include:

S300, forming a base substrate 10;

S302, forming a passivation protective layer 21 and an anode layer at a side of the base substrate 10; in which a plurality of inner cutting portions 210 arranged at intervals are formed at a side of the passivation protective layer 21 away from the base substrate 10, each of the inner cutting portions 210 has a first surface towards the base substrate 10 and a second surface away from the base substrate 10, an orthographic projection of the first surface on the base substrate 10 lies within an orthographic projection of the second surface on the base substrate 10, and there is a non-zero distance between an edge of the first surface and an edge of the second surface; the anode layer includes a plurality of anodes 11 arranged at intervals, and each of the anodes 11 is correspondingly formed on the second surface of the inner cutting portion 210, as shown in FIG. 6;

S304, forming an organic light-emitting functional layer with a hole injection layer on the base substrate 10, in which the hole injection layer includes a plurality of hole injection blocks 12 arranged at intervals, and each of the hole injection blocks 12 is correspondingly formed on one of the anodes 11;

S306, forming a cathode layer 17 at a side of the organic light-emitting functional layer facing away from the anode layer.

It should be understood that the structure and material selection of the organic electroluminescent structure fabricated by this fabrication method can refer to the description of the organic electroluminescent structure in the previous embodiments. Therefore, the specific structure, material selection and beneficial effects of the organic electroluminescent structure will not be described in detail any more in this embodiment.

In S300, a base substrate 10 is formed. Since the preparation of the base substrate 10 is relatively mature, it will not be described in detail herein.

Optionally, S302 may include S3020 and S3022.

In S3020, a passivation protective material and an anode material are sequentially formed on the base substrate 10. For example, the passivation protective material and the anode material may be formed on the base substrate 10 by magnetron sputtering, evaporation, or the like. It should be noted that the passivation protective material and the anode material are sequentially coated on the whole surface of the base substrate, and the whole surface coating as mentioned refers to that the whole surface of the base substrate 10 is coated with the passivation protective material and the anode material.

In S3022, sides of the anode material and the passivation protective material away from the base substrate 10 are sequentially patterned in order to form an anode layer and a passivation protective layer 21 having a plurality of inner cutting portions 210 arranged at intervals. In particular, S3022 may include S30220 and S30222.

In S30220, the anode material is patterned by a first dry etching process to form an anode layer. The first dry etching process may be isotropic, but is not limited thereto.

In S30222, a second dry etching process mainly based on isotropy is applied to pattern the side of the passivation protective material away from the base substrate 10, so as to form a plurality of inner cutting portions arranged at intervals. For example, after the anode material is patterned by the first dry etching process, the etching is mainly isotropic by controlling the bias power, and then a side of the passivation protective material away from the base substrate 10 is patterned.

Before the dry etching process is performed on the anode material, a photolithography process may also be included; after the dry etching process is performed on the passivation protective material, an adhesive (for example, photoresist in this embodiment) removal process may also be included. As the photolithography process and the photoresist removal process are relatively mature processes, which will not be described in detail herein.

It should be noted that, after S300 and before S302, S301 may be further included to form a driving circuit and a metal composite layer. The structure and positional relationship of the driving circuit and the metal composite layer can refer to the above description of the organic electroluminescent structure, and will not be repeated herein.

Figure 7:
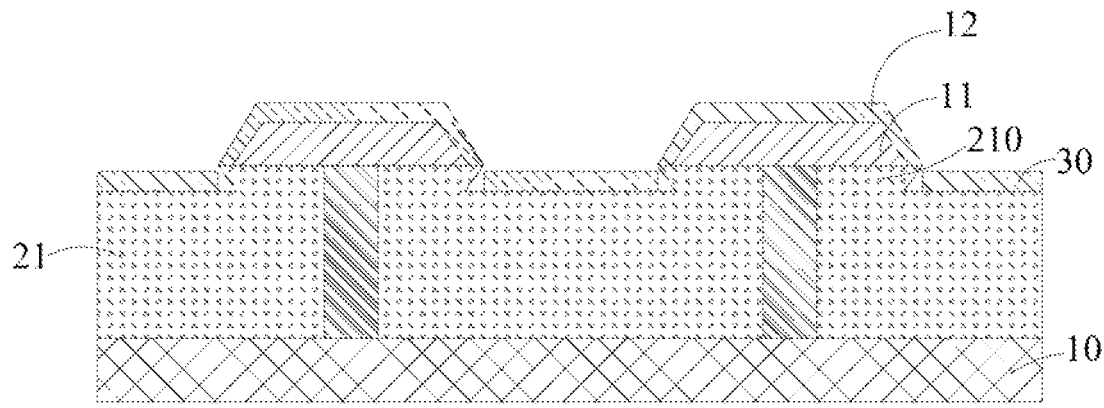
FIG. 7 is a schematic view after S3040 is completed.

Optionally, S304 may include:

S3040, evaporating a hole injection material on the base substrate formed with the inner cutting portions 210 by using an evaporation process to form a hole injection layer with a plurality of hole injection blocks 12 arranged at intervals, as shown in FIG. 7; it should be noted that the hole injection blocks 12 wraps around the anode 11, so that the contact area between the hole injection blocks 12 and the anode 11 is increased, thereby improving the carrier injection and the display effect.

In addition, the hole injection layer may further include a hole injection waste 30 formed on the base substrate 10 and located between adjacent anodes 11, the hole injection waste 30 is partitioned from the hole injection blocks 12. It should be noted that since the hole injection waste 30 and the hole injection blocks 12 have been disconnected by the inner cutting portion 210, it is not required to remove the hole injection waste 30, and thereby reducing the fabricating difficulty.

S304 is not limited to the above-described S3040. After the S3040, S304 may further include S3042, e.g., forming the hole transport layer 13, the organic light emitting layer 14, the electron transport layer 15, and the electron injection layer 16, sequentially. The hole transport layer 13, the organic light emitting layer 14, the electron transport layer 15, and the electron injection layer 16 may be formed by a vapor deposition, but are not limited thereto, and may also be formed in other manners.

After S306, the fabrication method of the organic electroluminescent structure may further include S308, e.g., forming a packaging thin film 22 at a side of the cathode layer 17 away from the base substrate 10.

Another embodiment of the present disclosure also provides a display device, as shown in FIG. 4. The display device includes the organic electroluminescent structure described in any one of the above embodiments; however, it is not limited thereto, when the organic light-emitting layer 14 in the organic electroluminescent structure is arranged as the whole surface and emits white light, the display device may further include a color film substrate 23, which may be formed at a light-emitting side of the organic electroluminescent structure.

According to the embodiment of the present disclosure, the specific type of the display device is not particularly limited, and the types of display devices, such as an OLED display, a mobile phone, a TV, a watch, or the like commonly used in the field can be used, and those skilled in the art can make corresponding choices according to the specific use of the display device, which will not be described in detail herein.

It should be noted that, in addition to the organic electroluminescent structure, the display device also includes other necessary parts and components. As an example, the display, such as a housing, a power cord, or the like can be supplemented according to the specific use requirements of the display device, and will not be described in detail herein.

It should be noted that although the actions of the method in the present disclosure are described in a specific order in the drawings, this does not require or imply that these actions must be performed in the specific order, or that all the actions shown must be performed to achieve the desired results. Additionally or alternatively, some of the actions may be omitted, multiple actions may be combined into a single process to be performed, and/or a single process may be decomposed into multiple processes to be performed, etc., all of which shall be regarded as a part of this disclosure.

It should be understood that this application is not limited to the detailed structure and arrangement of the components set forth in this specification. The application can have other embodiments and can be implemented and executed in various ways. The foregoing variations and modifications fall within the scope of this application. It should be understood that the present disclosure disclosed and defined in this specification extends to all alternative combinations of two or more individual features mentioned or apparent in the text and/or the drawings. All these different combinations constitute several alternative aspects of this application. The embodiments of this specification illustrate the best mode known for carrying out this application, and enable those skilled in the art to utilize this application.

What is claimed is:

1. An organic electroluminescent structure, comprising:
   a base substrate;
   a passivation protective layer formed at a side of the base substrate, in which a plurality of inner cutting portions arranged at intervals are formed at a side of the passivation protective layer inner cutting portion facing away from the base substrate, each of the inner cutting portions has a first surface towards the base substrate and a second surface away from the base substrate, an orthographic projection of the first surface on the base substrate is within an orthographic projection of the second surface on the base substrate, and there is a non-zero distance between an edge of the first surface and an edge of the second surface;
   an anode layer comprising a plurality of anodes arranged at intervals, and each of the anodes is correspondingly formed on the second surface;
   an organic light-emitting functional layer having a hole injection layer, in which the hole injection layer comprises a plurality of hole injection blocks arranged at intervals, and each of the hole injection blocks is correspondingly formed on the anode; and
   a cathode layer formed at a side of the organic light-emitting functional layer facing away from the anode layer.

2. The organic electroluminescent structure according to claim 1, wherein, in a direction from the first surface to the second surface, an area of a cross-section of the inner cutting portions gradually increases, and the cross-section is a plane parallel to the base substrate.

3. The organic electroluminescent structure according to claim 2, wherein the orthographic projection of the first surface on the base substrate is in a center area of the orthographic projection of the second surface on the base substrate.

4. The organic electroluminescent structure according to claim 1, wherein a thickness of the inner cutting portion is larger than a thickness of the hole injection layer.

5. The organic electroluminescent structure according to claim 4, wherein the thickness of the inner cutting portion is 100 Å to 2500 Å.

6. The organic electroluminescent structure according to claim 1, wherein the anode is a transparent electrode.

7. The organic electroluminescent structure according to claim 5, further comprising:
   a metal composite layer having a plurality of metal composite portions arranged at intervals, each of the metal composite portions being connected with one of the anodes;
   wherein the metal composite portion comprises a metal protective film, a metal reflective film, and a first conductive connection block sequentially stacked on the base substrate, in which the metal reflective film is at a side of the inner cutting portion away from the anode, and the first conductive connection block passes through the inner cutting portion and is connected with the anode.

8. The organic electroluminescent structure according to claim 7, further comprising:
   a driving circuit disposed at a side of the metal composite layer close to the base substrate,
   wherein the driving circuit comprises a transistor, in which the transistor is connected with the metal composite layer through a second conductive connection block, and the transistor has a semiconductor layer that is positioned inside the base substrate.

9. A fabrication method of an organic electroluminescent structure, comprising:
   forming a base substrate;
   forming a passivation protective layer and an anode layer at a side of the base substrate; in which a plurality of inner cutting portions arranged at intervals are formed at a side of the passivation protective layer away from the base substrate, each of the inner cutting portions has a first surface towards the base substrate and a second surface away from the base substrate, an orthographic projection of the first surface on the base substrate is within an orthographic projection of the second surface on the base substrate, and there is a non-zero distance between an edge of the first surface and an edge of the second surface; the anode layer comprises a plurality of anodes arranged at intervals, and each of the anodes is correspondingly formed on the second surface;

forming an organic light-emitting functional layer with a hole injection layer on the base substrate, in which the hole injection layer comprises a plurality of hole injection blocks arranged at intervals, and each of the hole injection blocks is correspondingly formed on one of the anodes; and forming a cathode layer at a side of the organic light-emitting functional layer facing away from the anode layer.

10. The fabrication method according to claim 9, wherein forming the passivation protective layer and the anode layer at the side of the base substrate, comprises:

forming a passivation protective material and an anode material sequentially on the base substrate; and patterning the anode material and a side of the passivation protective material away from the base substrate, so as to form the anode layer and the passivation protective layer with a plurality of inner cutting portions arranged at intervals.

11. The fabrication method according to claim 10, wherein patterning the anode material and the side of the passivation protective material away from the base substrate, so as to form the anode layer and the passivation protective layer with the plurality of inner cutting portions arranged at intervals, comprises:

patterning the anode material by using a first dry etching process to form the anode layer; and patterning the side of the passivation protective material away from the base substrate by using a second dry etching process mainly based on isotropy to form a plurality of inner cutting portions arranged at intervals.

12. The fabrication method according to claim 9, wherein forming the organic light-emitting functional layer with the hole injection layer on the base substrate, comprises:

evaporating a hole injection material on the base substrate in which the inner cutting portions is formed by using an evaporation process, so as to form a hole injection layer comprising a plurality of hole injection blocks arranged at intervals.

13. A display device, comprising:
an organic electroluminescent structure, comprising:
a base substrate;
a passivation protective layer formed at a side of the base substrate, in which a plurality of inner cutting portions arranged at intervals are formed at a side of the passivation protective layer inner cutting portion facing away from the base substrate, each of the inner cutting portions has a first surface towards the base substrate and a second surface away from the base substrate, an orthographic projection of the first surface on the base substrate is within an orthographic projection of the second surface on the base substrate, and there is a non-zero distance between an edge of the first surface and an edge of the second surface;

an anode layer comprising a plurality of anodes arranged at intervals, and each of the anodes is correspondingly formed on the second surface;

an organic light-emitting functional layer having a hole injection layer, in which the hole injection layer comprises a plurality of hole injection blocks arranged at intervals, and each of the hole injection blocks is correspondingly formed on the anode; and a cathode layer formed at a side of the organic light-emitting functional layer facing away from the anode layer.

14. The display device according to claim 13, wherein, in a direction from the first surface to the second surface, an area of a cross-section of the inner cutting portions gradually increases, and the cross-section is a plane parallel to the base substrate.

15. The display device according to claim 14, wherein the orthographic projection of the first surface on the base substrate is in a center area of the orthographic projection of the second surface on the base substrate.

16. The display device according to claim 13, wherein a thickness of the inner cutting portion is larger than a thickness of the hole injection layer.

17. The display device according to claim 16, wherein the thickness of the inner cutting portion is 100 Å to 2500 Å.

18. The display device according to claim 13, wherein the anode is a transparent electrode.

19. The display device according to claim 17, wherein:
the organic electroluminescent structure further comprises a metal composite layer having a plurality of metal composite portions arranged at intervals, each of the metal composite portions being connected with one of the anodes;

the metal composite portion comprises a metal protective film, a metal reflective film, and a first conductive connection block sequentially stacked on the base substrate, in which the metal reflective film is at a side of the inner cutting portion away from the anode, and the first conductive connection block passes through the inner cutting portion and is connected with the anode.

20. The display device according to claim 19, wherein:
the organic electroluminescent structure further comprises a driving circuit disposed at a side of the metal composite layer close to the base substrate; and the driving circuit comprises a transistor, in which the transistor is connected with the metal composite layer through a second conductive connection block, and the transistor has a semiconductor layer that is positioned inside the base substrate.

* * * * *